United States Patent [19]

Scepanovic et al.

[11] Patent Number: 5,784,287

[45] Date of Patent: *Jul. 21, 1998

[54] PHYSICAL DESIGN AUTOMATION SYSTEM AND PROCESS FOR DESIGNING INTEGRATED CIRCUIT CHIPS USING GENERALIZED ASSIGNMENT

[75] Inventors: Ranko Scepanovic; James S. Koford, both of San Jose; Edwin R. Jones, Sunnyvale, all of Calif.; Valeriy B. Kudryavtsev, Moscow, Russian Federation; Alexander E. Andreev, Moskovskaja Oblast, Russian Federation; Stanislav V. Aleshin; Alexander S. Podkolzin, both of Moscow, Russian Federation

[73] Assignee: LSI Logic Corporation, Milpitas, Calif.

[*] Notice: The term of this patent shall not extend beyond the expiration date of Pat. No. 5,699,265.

[21] Appl. No.: 536,004

[22] Filed: Sep. 29, 1995

[51] Int. Cl.$^6$ ................................................. G06F 17/50
[52] U.S. Cl. ................................. 364/490; 364/491
[58] Field of Search ................................. 364/488, 489, 364/490, 491

[56] References Cited

U.S. PATENT DOCUMENTS

| | | | |
|---|---|---|---|
| 3,617,714 | 11/1971 | Kernighan | 364/488 |
| 5,187,784 | 2/1993 | Rowson | 395/500 |
| 5,359,538 | 10/1994 | Hui et al. | 364/491 |
| 5,513,124 | 4/1996 | Trimberger et al. | 364/491 |
| 5,521,836 | 5/1996 | Hartoog et al. | 364/491 |
| 5,566,078 | 10/1996 | Ding et al. | 364/490 |

OTHER PUBLICATIONS

Wei et al.,"Towards Efficient Hierarchical Designs by Ratio Cut Partitioning," ICCAD'89, pp. 298–301, 1989.

Metropolis et al., "Equation of State Calculations by Fast Computing Machines," Journal of Chemistry and Physics, pp. 1087–1092, 1993.

Saab et al., "Stochastic Evolution: A Fast Effective Heuristic for Some Generic Layout Problems," Design Automation Conf., pp. 26–31, 1990.

Kleinhans et al., "GORDIAN: VLSI Placement by Quadratic Programming and Slicing Optimization," IEEE Transactions on CAD, pp. 356–365, 1991.

Sechen et al., "An Improved Objective Function for Mincut Circuit Partitioning," ICCAD '88, pp. 502–505, 1988.

Kernighan et al., "An Efficient Heuristic Procedure for Partitioning Graphics" Bell System Technical Journal, 49, pp. 291–307, 1970.

(List continued on next page.)

Primary Examiner—Emanuel T. Voeltz
Assistant Examiner—Leigh Marie Garbowski
Attorney, Agent, or Firm—Oppenheimer Wolff & Donnelly LLP

[57] ABSTRACT

A process for designing an integrated circuit chip s comprises specifying a plurality of regions on the chip in which a plurality of objects are to be placed, such that there are more of the objects than the regions, and specifying penalties for the objects to be placed in the regions respectively. The objects can be microelectronic cells, interconnect wiring segments, etc. An assignment of the objects to the regions is constructed, and a number of objects for movement between the regions is selected. An optimal permutation of movement of the selected number of objects between the regions is computed such that a cost corresponding to the total penalties for the assignment is maximally reduced, and the assignment is modified by moving the selected number of objects through the optimal permutation. The process steps are repeated iteratively such that a maximum number of objects which will produce a maximal reduction in cost is moved during each iteration. The optimal permutation is determined by computing penalty changes for moving the objects between the regions respectively, defining a penalty change scale having a plurality of subintervals, assigning the objects to the penalty change scale in accordance with their penalty changes, and moving the objects which have penalty changes in a number of subintervals having largest values of negative penalty change.

32 Claims, 11 Drawing Sheets

OTHER PUBLICATIONS

Fiduccia et al., "A Linear Time Heuristic for Improving Network Partitions," 19$^{th}$ Design Automation Conference, pp. 175–181, 1982.

Kring et al., "A Cell Replicating Approach to Mincut Based Circuit Partitioning," IEEE Int'l Conference on CAD, pp. 2–5, 1991.

Sherwani, Naveed A., *Algorithms For VLSI Physical Design Automation*, Kluwer Academic Publishers, 1993, pp. 173–174.

Bertsekas, Dimitri P., *Linear Network Optimization: Algorithms and Codes*, The MIT Press, 1991, pp. 167–243.

Murty, Katta G., *Network Programming*, Prentice Hall, 1992, pp. 168–187.

| $\lambda$ r,1,2 | $\lambda$ r,1,3 | $\lambda$ r,1,4 |
|---|---|---|
| $\lambda$ r,2,1 | $\lambda$ r,2,3 | $\lambda$ r,2,4 |
| $\lambda$ r,3,1 | $\lambda$ r,3,2 | $\lambda$ r,3,4 |
| $\lambda$ r,4,1 | $\lambda$ r,4,2 | $\lambda$ r,4,3 |

| $\lambda$ 1,1,2 | $\lambda$ 2,1,2 | • • • • • | $\lambda$ k,1,2 |
|---|---|---|---|

NORMALIZED PENALTY CHANGE →

|  |  |  |
|---|---|---|
| Ω 1,2 | Ω 1,3 | Ω 1,4 |
| Ω 2,1 | Ω 2,3 | Ω 2,4 |
| Ω 3,1 | Ω 3,2 | Ω 3,4 |
| Ω 4,1 | Ω 4,2 | Ω 4,3 |

PHYSICAL DESIGN AUTOMATION SYSTEM AND PROCESS FOR DESIGNING INTEGRATED CIRCUIT CHIPS USING GENERALIZED ASSIGNMENT

BACKGROUND OF THE INVENTION

1. Field of the Invention

The present invention generally relates to the art of microelectronic integrated circuits, and more specifically to a physical design automation system and process for designing integrated circuit chips.

2. Description of the Related Art

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

Prior art methods for achieving this goal comprise generating one or more initial placements, modifying the placements using optimization methodologies including Genetic Algorithms such as simulated evolution, force directed placement or simulated annealing, and comparing the resulting placements using a cost criteria.

In conventional chip design, the positions of certain "unmovable" cells (external interconnect terminals or pads, large "megacells" etc.) will be fixed a priori by the designer. Given those fixed positions, the rest of the cells are then placed on the chip. Since the unmovable cells and pads are located or placed before the placement for the rest of the cells of chip has been decided on, it is unlikely that the chosen positions will be optimal.

In this manner, a number of regions, which may have different sizes and shapes, are defined on the chip for placement of the rest of the cells.

It is desirable to assign individual cells to the regions such that the total interconnect wirelength is minimized. However, methodologies for accomplishing this goal efficiently have not been proposed heretofore.

Known methods for assigning objects to regions or areas include the "Auction" and "Hungarian" algorithms. The Auction algorithm is described in, for example, a textbook entitled "Linear Network Optimization: Algorithms and Codes", by D. Bertsekas, MIT Press, Cambridge, Ma., 1991, pp. 167-243. The Hungarian algorithm is described in, for example, a textbook entitled "Network Programming", by K. Murty, Prentice Hall, Englewood Cliffs, N.J., 1992, pp. 168-187.

Both of these algorithms are deficient for design automation of integrated circuit chips because they are limited to objects having the same size. In addition, they have excessively long run times when implemented on a digital computer. This is because they have at least quadratic complexity. The complexity of the Hungarian algorithm, for example, is $O(n^3)$.

In addition to placing cells in regions on an integrated circuit chip, an efficient method of placing different kinds of objects in regions for integrated circuit design automation is needed in the art. An example of such an application is assigning interconnect wiring segments of different lengths to wiring channels having different capacities.

SUMMARY OF THE INVENTION

A physical design automation system and process for designing an integrated circuit chip in accordance with the present invention comprises specifying a plurality of regions on the chip in which a plurality of objects are to be placed, such that there are more of the objects than the regions, and specifying penalties for the objects to be placed in the regions respectively.

The objects can be microelectronic cells, interconnect wiring segments, etc. An assignment of the objects to the regions is constructed, and a number of objects for movement between the regions is selected. An optimal permutation of movement of the selected number of objects between the regions is computed such that a cost corresponding to the total penalties for the assignment is maximally reduced, and the assignment is modified by moving the selected number of objects through the optimal permutation.

The process steps are repeated iteratively such that a maximum number of objects which will produce a maximal reduction in cost is moved during each iteration.

The optimal permutation is determined by computing penalty changes for moving the objects between the regions respectively, defining a penalty change scale having a plurality of subintervals, assigning the objects to the penalty change scale in accordance with their penalty changes respectively, and moving the objects which have penalty changes in a number of subintervals having largest values of negative penalty change.

In a preferred form of the invention, the physical design automation system is embodied as a programmed digital computer comprising a memory, an operating program stored in the memory, and a processor for executing the program.

The present system is capable of assigning a variety of objects having different sizes and shapes to regions having different capacities (sizes and shapes). In a preferred application of the invention, the objects are microelectronic devices or cells, and the regions are areas on an integrated circuit chip. In another application, the objects are interconnect wiring segments, and the regions are interconnect wiring channels.

The present invention overcomes the limitations of the prior art in that it is capable of operating on objects of different sizes and shapes. In addition, the complexity of the present process where implemented on a digital computer is linear, thereby producing results with greatly reduced run times as compared to the prior art.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
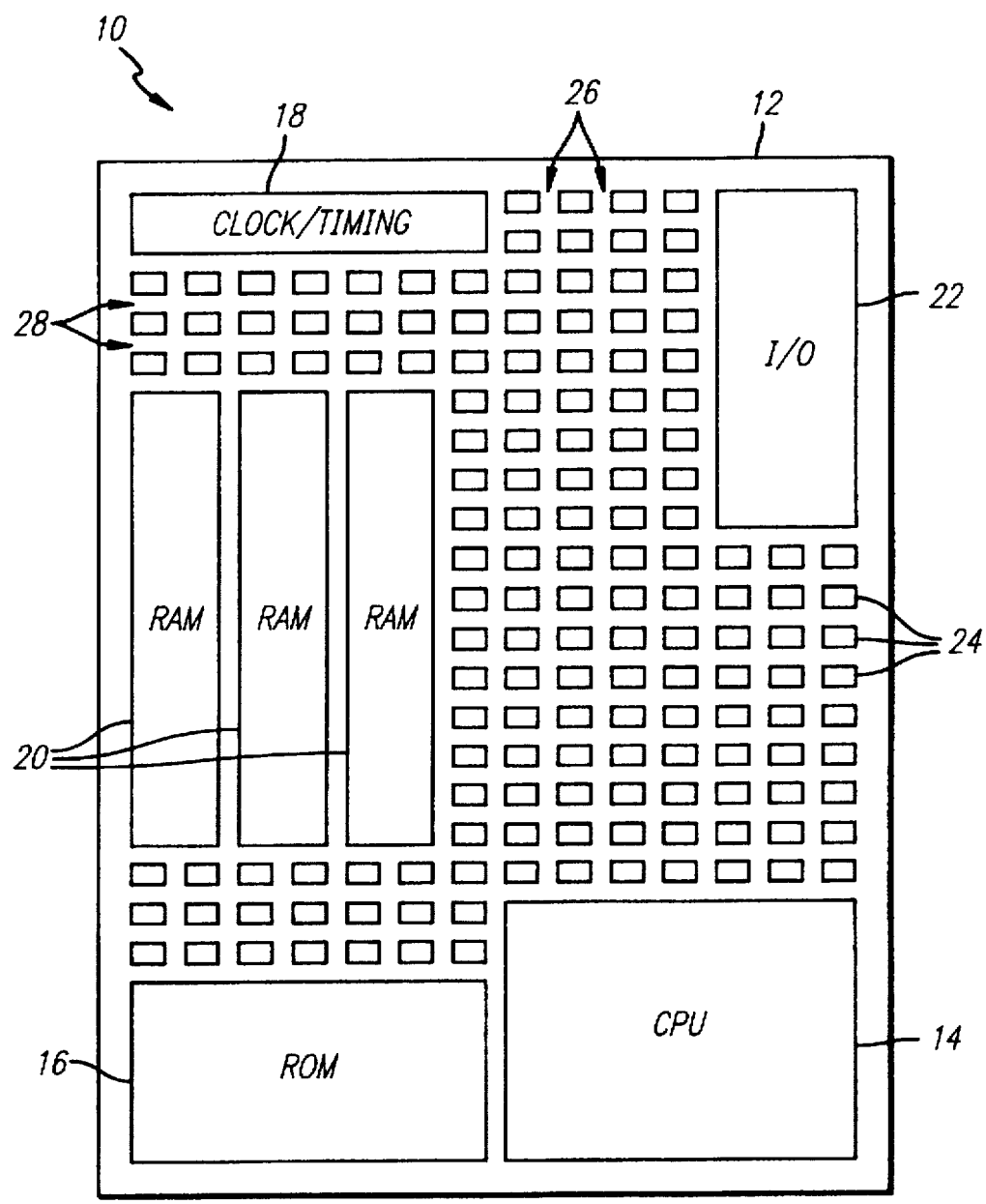
FIG. 1 is a simplified diagram illustrating an integrated circuit chip which can be optimally designed in accordance with the present invention.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

Figure 2A:
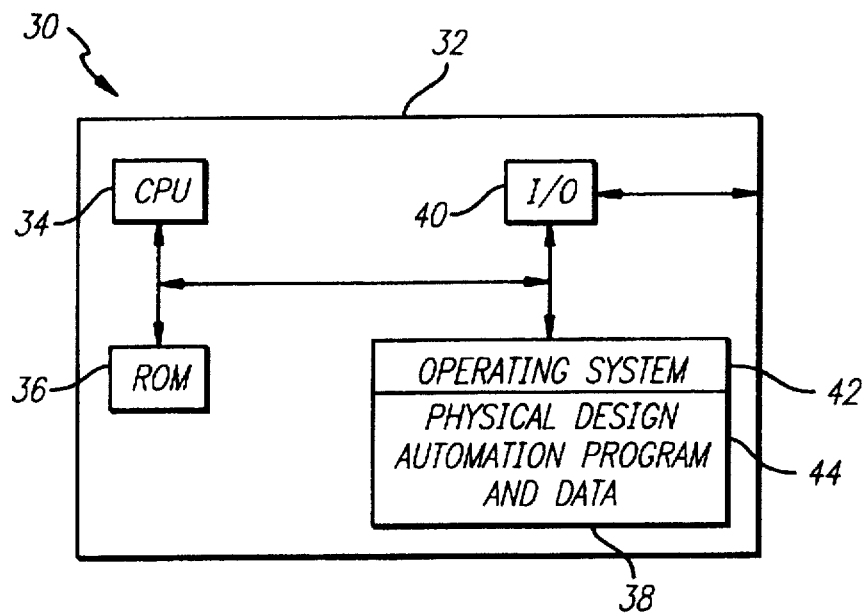
FIG. 2a is a block diagram of a physical design automation system according to the present invention as embodied by a programmed digital computer.

FIG. 2a illustrates an integrated circuit physical design automation system 30 for producing an optimized placement of the cells 24 such as illustrated in FIG. 1 in accordance with a method or process of the present invention. The system 30 comprises a programmed digital computer 32 which may be of conventional type, including a processor such as a Central Processing Unit 34, a Read Only Memory (ROM) 36 for storing firmware, a Random Access Memory (RAM) 38 for storing an operating program and data, and an Input-Output (I/O) 40 for connecting the computer 32 to external devices.

The RAM 38 stores an operating system 42 such as UNIX, and a physical design automation program and data 44 for implementing the process of the present invention. The system 30 performs its function of physical design automation by causing the CPU 34 to execute the operating program 44 using input parameters specified by a user.

Figure 2B:
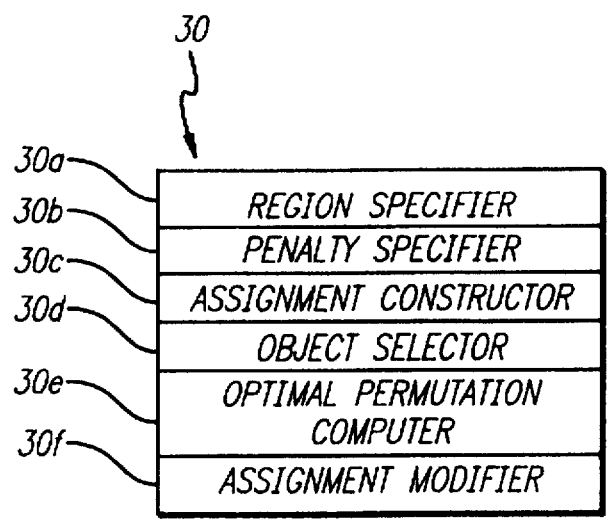
FIG. 2b is a diagram illustrating a physical design automation system according to the present invention as embodied by the hardware and software of the programmed digital computer of FIG. 2a operating in combination.

The system 30, as comprising the elements illustrated in FIG. 2a taken in combination, is illustrated in the form of a block diagram in FIG. 2b. As will be better understood from the detailed description below, the system 30 generally comprises the following units:

A region specifying unit 30a for specifying a plurality of regions on the chip in which a plurality of objects are to be placed, such that there are more of the objects than the regions.

A penalty specifying unit 30b for specifying penalties for the objects to be placed in the regions respectively.

An assignment constructing unit 30c for constructing an assignment of the objects to the regions.

An object selecting unit 30d for selecting a number of objects for movement between the regions.

An optimal permutation computing unit 30e for computing an optimal permutation of movement of the selected number of objects between the regions such that a cost corresponding to the total penalties for the assignment is maximally reduced.

An assignment modifying unit 30f for modifying the assignment by moving the selected number of objects through the optimal permutation.

The present system 30 will be described below as being applied to assigning cells to regions on an integrated circuit chip. However, it will be understood that the invention is not so limited, and can be advantageously applied to other uses such as assigning interconnect wiring segments of different lengths to wiring channels of different capacities.

Figure 3:
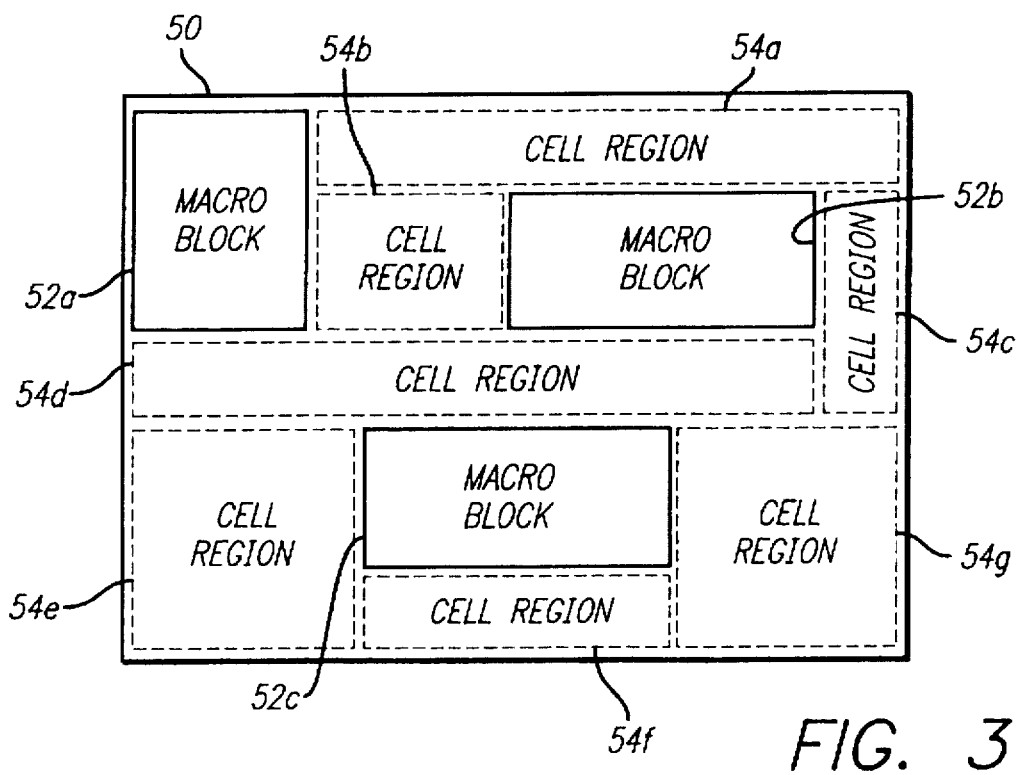
FIG. 3 is a diagram illustrating an integrated circuit chip including a plurality of macroblocks, and regions in which cells are to be placed by the present physical design automation system.

FIG. 3 illustrates one arrangement of regions in which cells are to be assigned or placed. An integrated circuit chip 50 includes a plurality of fixed macroblocks 52a to 52c as described with reference to FIG. 1. The irregularly shaped area which is not covered by the macroblocks 52a to 52c is divided into rectangular cell regions 54a to 54g having different sizes and shapes. A large number of cells, which are not illustrated in FIG. 3, are to be assigned to the regions 54a to 54g.

Figure 4:
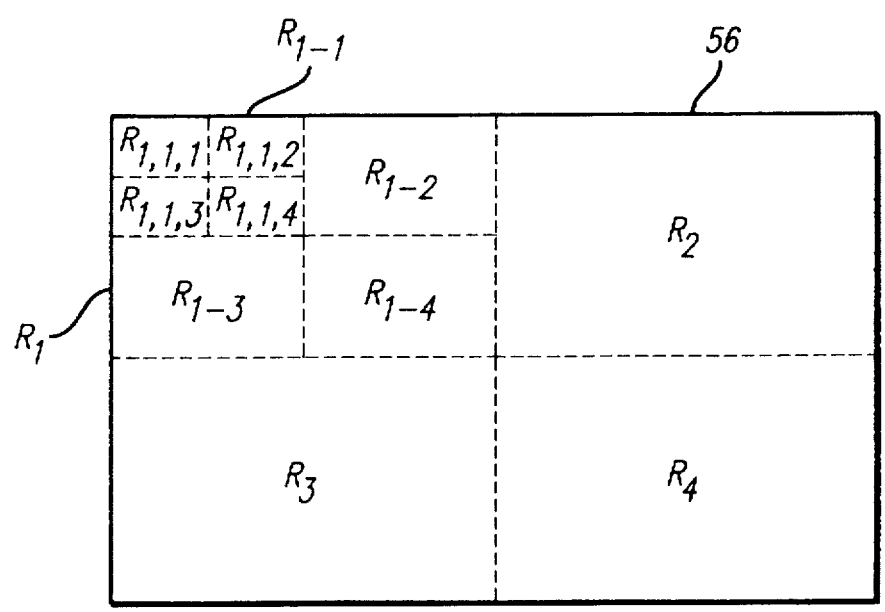
FIG. 4 is similar to FIG. 3, but illustrates a chip which is hierarchically partitioned into progressively smaller regions.

FIG. 4 illustrates another arrangement of regions in which cells are to be assigned or placed. An integrated circuit chip 56 has a single area in which a large number of cells are to be placed in a "Sea of Gates" configuration. The chip 56 is hierarchically divided into a plurality of regions and subregions. For example, as illustrated, the chip 56 is initially divided into four regions $R_1$ to $R_4$, which are in turn divided into four subregions.

For simplicity of illustration, only four subregions $R_{1-1}$ to $R_{1-4}$ of the region $R_1$ are shown in the drawing. The subregions can themselves be subdivided into subregions, down to any number of levels. For example, the subregion $R_1 1$ is shown as being subdivided into four subregions $R_{1-1-1}$ to $R_{1-1-4}$.

It is further within the scope of the invention to combine the arrangements of FIGS. 3 and 4. For example, the cell region 54a of FIG. 3 can be hierarchically subdivided into subregions as illustrated in FIG. 4. The designation of regions in which cells, wiring segments, etc. are to be assigned is arbitrary, specified by the user, and is not limited to any particular configuration within the scope of the invention.

Figures 5, 7:
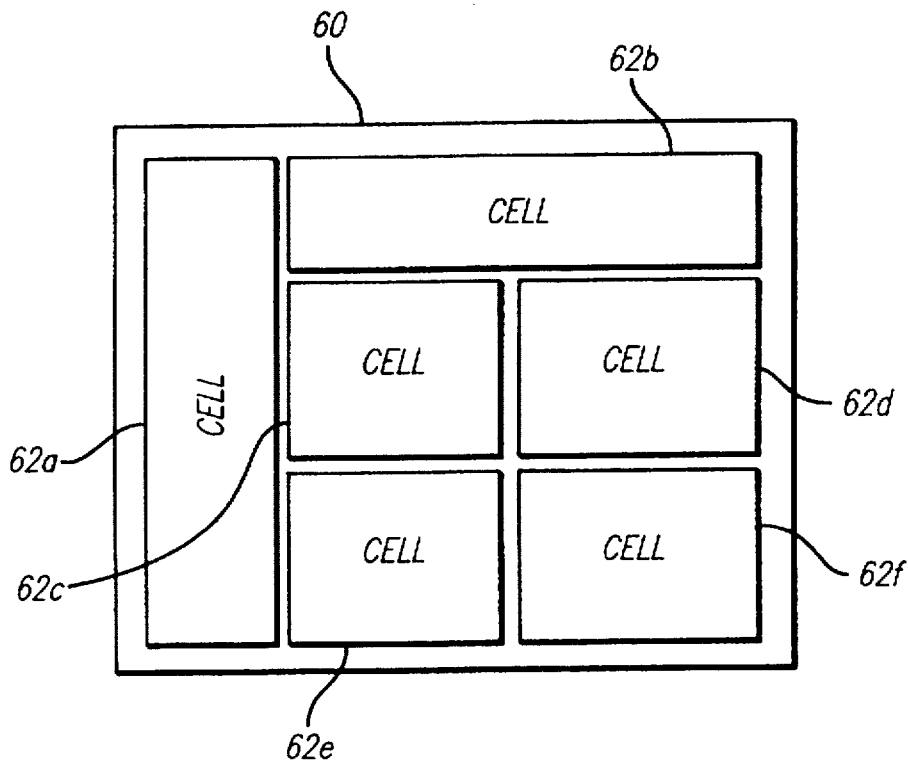
FIG. 5 is a diagram illustrating how cells which are placed by the present system can have different sizes and shapes.
FIG. 7 is a diagram illustrating a two dimensional array of penalties for objects and regions.

Further, as illustrated in FIG. 5, cells which are to be assigned to regions can have the same size and shape or, as illustrated, have different sizes and shapes. For example, a region 60 can have cells 62a to 62f having different heights and widths assigned to and placed therein.

The following conventions will be used in the detailed description of the present invention.

| | |
|---|---|
| $O_i$ | object |
| i | index for object |
| n | number of objects |
| $s_i$ | sizes of object |

-continued

| | |
|---|---|
| $R_j$ | region |
| j | index for region |
| m | number of regions |
| $c_m$ | capacity of region |
| $\psi$ | penalty |
| $\Psi$ | normalized penalty |
| $\Delta\Psi$ | normalized penalty change |
| F | assignment |
| p | permutation |
| $I_r$ | subinterval |
| r | index for subinterval |
| k | number of subintervals |
| x | subinterval corresponding to $V_L$ |
| $\delta$ | accuracy parameter |
| M | maximum normalized penalty |
| $V_L$ | group size |
| L | index for group size |
| $V_T$ | maximum group size |
| $V_o$ | optimal group size |
| C | group size constant |
| $\lambda$ | total size of objects in subinterval |
| $\Omega$ | change of cost function for moving $V_L$ group size |

As a first step in practicing the present invention, with reference being made to FIG. 7, penalties $\psi$ are specified for assigning each object to each region. For cell placement, a penalty can be considered as a negative affinity, with the affinity being an attractive force determined by a conventional force directed placement algorithm based on a model of masses and springs.

The attractive force is typically computed as a function of the number of interconnect wiring nets connecting the cell to other cells in the region. The manner in which the affinities (penalties) are computed in not the particular subject matter of the present invention and will not be described in detail. A conventional force directed placement algorithm for computing attractive forces and affinities (negative penalties) is described in, for example, a textbook entitled "Algorithms for VLSI Physical Design Automation" by Naveed Sherwani, Kluwer Academic Publishers 1993. pp. 173–174.

The number n of objects (cells) $O_i$, sizes $S_i$ of objects $O_i$, number m of regions $R_j$, capacities $c_j$ of regions m, and penalties $\psi(i,j)$ for assigning the object $O_i$ to region $R_j$ are specified by the user as a two dimensional array having the form illustrated in FIG. 7. The capacity $c_j$ of a region $R_j$ is the size (area) of the region which is available to have objects placed therein.

There will generally be many more objects than regions.

Figure 6:
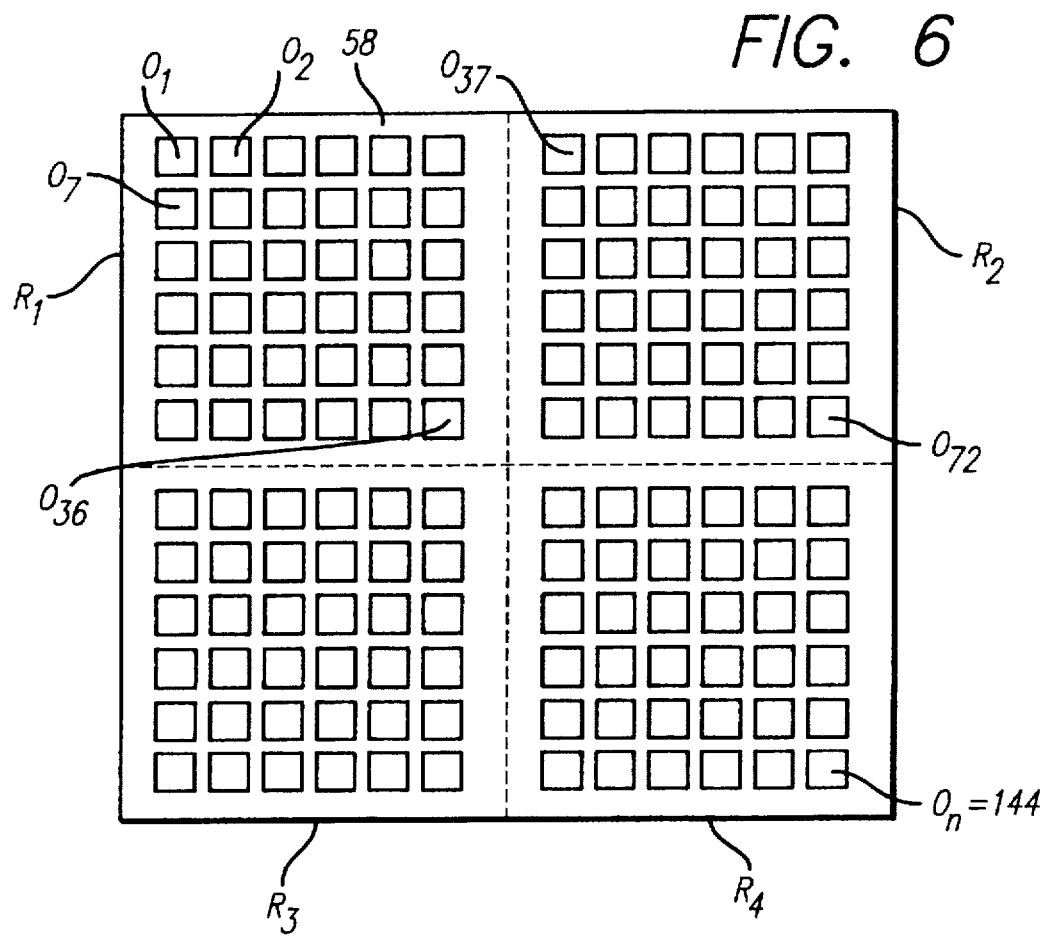
FIG. 6 is a diagram illustrating an initial assignment of a plurality of cells to a plurality of regions on a chip.

For example, in a typical integrated circuit chip, there can be 100,000 objects (cells) to be assigned to four regions. FIG. 6 illustrates a simplified chip 58 in which 36 objects $O_i$ are to be placed in each region $R_j$, where n=144 and m=4. Although the objects $O_1$ to $O_{144}$ are illustrated as having the same size and shape, they can have different sizes and shapes within the scope of the invention.

Figure 8:
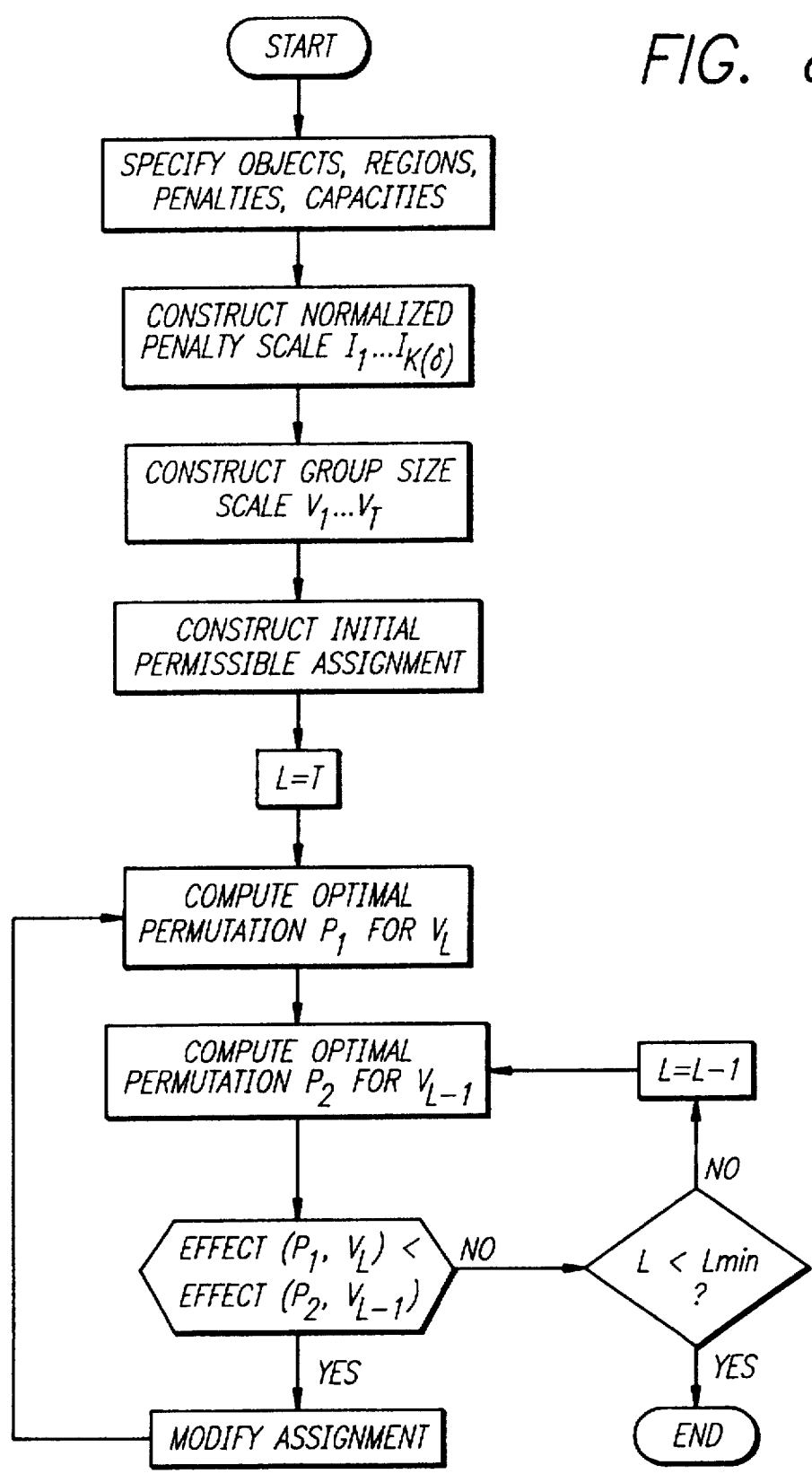
FIG. 8 is a flowchart illustrating the process of the present invention.

FIG. 8 is a flowchart illustrating the main process steps of the present invention. The following detailed description will be presented within the framework of the flowchart.

The generalized assignment problem which is solved by the present invention can be formulated as follows.

Given set of n objects $O_1 \ldots O_n$ with sizes $s_1 \ldots s_n$, regions $R_1 \ldots R_m$ with capacities $c_1 \ldots c_m$ and penalty $\psi(i,j)$ of the object $O_i$ to be in the region $R_j$ for each i=1 . . . n and j =1 . . . m (n×m matrix).

A permissible assignment F:F(i)=j, of the object $O_i$ to the region $R_j$ is an assignment which satisfies the condition that for each region, the sum of sizes of all objects assigned to that region is not greater than the capacity of the region. The cost function of the assignment F is equal to the total penalty:

$$COST(F) = \sum_{i=1}^{n} \psi(i, F(i))$$

The goal is to find the assignment F with the minimal COST(F).

Figures 9, 10A, 10B:
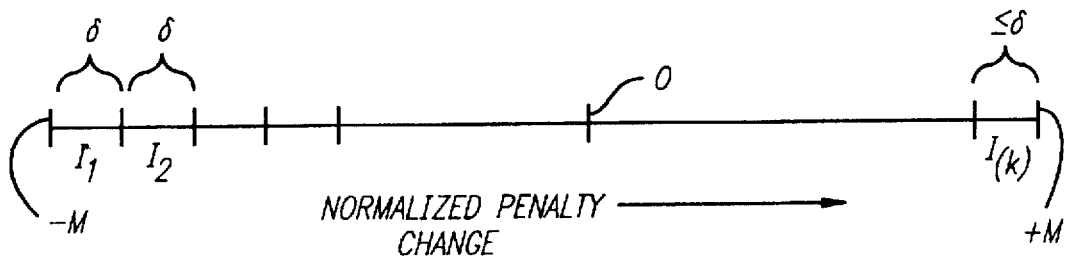
FIG. 9 is a diagram illustrating the construction of a normalized penalty scale.
FIGS. 10a and 10b in combination illustrate the construction of a three dimensional array of normalized penalty summed values for subintervals.

After specifying the objects, regions, capacities and penalties as described above, a normalized penalty change scale is constructed as illustrated in FIG. 9. Normalized penalties $\Psi(i,j)$ are computed by dividing the penalties $\Psi$ (i,j) by the sizes of the objects as $$\psi(i,j) = \frac{\psi(i,j)}{S_i}$$

The normalized penalty change $\Delta\Psi$ resulting from moving each object between each two regions is then computed. For example, if an object has a normalized penalty $\Psi_1=-4$ in a region $R_1$ and a penalty $\Psi_2=-6$ in a region $R_2$, and is moved from the region $R_1$ to the region $R_2$, the normalized penalty change $\Delta\Psi=(-6)-(-4)=-2$.

The normalized penalty change scale is specified as having a minimum (most negative) value $-M$ and a maximum (most positive) value $+M$, where $$M = 2 \; XMAX|\Psi(i, j)|$$

The normalized penalty change scale is divided into k subintervals $I_r=I_1 \ldots I_k$, where $k \approx 2M/\delta$, and $\delta$ is a constant;

The normalized penalty change scale has maximum values $-M$ and $+M$ equal to twice the maximum value of normalized penalty to accommodate a maximum penalty change in either direction. For example, if the maximum penalty for all objects is $-5$, and an object is moved from a region having a penalty of $-5$ to a region having a penalty of $+5$, the penalty change will be $(+5)-(-5)=+10$, or twice the maximum normalized penalty.

Since penalty is the negative of affinity, negative penalty changes are desirable since they decrease the cost of the assignment. It will be noted that if all objects have the same width or height, all normalized penalties $\Psi$ will be proportional to the penalties $\psi$ by the same proportionality constant, and the normalization computation can be omitted.

The quantity $\delta$ is the "accuracy factor", and is selected in accordance with the characteristics of the computer on which the design automation program is run. Smaller values of $\delta$ will result in greater accuracy and longer computing time, and vice-versa. It will be further noted that the last subinterval $I_k$ can have a value of less than $\delta$.

The next step in the present process is the construction of a group size scale $V_L = \lceil C^{L-1} \rceil$, C>1, where $V_L = V_1 \ldots V_T$ are the group size values, C is a constant, and T is a maximum number such that:

$$V_T < \sum_{i=1}^{n} S_i$$

The latter constraint signifies that the total size of objects to be moved cannot exceed the total size of all of the objects. The value C is selected based on characteristics of the particular application, more specifically on the unit of measurement for the cell sizes. If, for example, C=2, the values of $V_L$ will be $V_1=1$, $V_2=2$, $V_3=8$, $V_4=16$, $V_5=32$, etc.

The next step of the present process is to construct an initial permissible assignment which is to be improved upon by the invention. The initial assignment can be generated randomly, or by using another algorithm. The constraint which must be satisfied is, as set forth above, that for each region, the sum of sizes of all objects assigned to that region is not greater than the capacity of the region.

Then, an initial value is assigned to L. The preferred initial value of L is T, although the invention is not so limited. Thus, the initial value of $V_L = V_T$.

The present invention produces a rapid improvement in the initial assignment (and iteratively improved versions thereof) by moving the maximum number of objects between regions which will produce a maximum reduction in the cost of the assignment. This is done by moving the selected number of objects which have the largest negative normalized penalty changes through a complete permutation of the regions.

For example, if there are four regions $R_1$-$R_4$, one possible permutation is 1-2-3-4, whereas another possible permutation is 1-3-4-2. The number of possible permutations is m-factorial (m!). Thus, for four regions, the number of possible permutations is $4! = 24$.

No region capacities will be exceeded upon completion of a permutation because the same number of objects is removed from and returned to each region. Although region capacities can be exceeded at intermediate stages of permutations, this does not affect the result of the process.

The number of objects to be moved in the first iteration ($V_L = V_T$) is determined by computing a three dimensional array of object sizes $\lambda(r,j_1,j_2)$, in which $\lambda$ represents the total size of the objects in each subinterval r for each pair of regions $j_1$ and $j_2$. An object lies in a subinterval if its normalized penalty change $\Delta\Psi$, when the object is moved from $j_1$ to $j_2$, has a value within the subinterval. The array can be expressed as:

$$\lambda(r, j_1, j_2) = \Sigma S_i, \; F(i)=j_1, \; (\Psi(i,j_2)-\Psi(i,j_1)) \in I_r$$

where r is an index for the subintervals and $$\Delta\Psi = \Psi(i, j_2) - \Psi(i, j_1).$$

FIGS. 10a and 10b illustrate the array $\lambda(r,j_1,j_2)$, where FIG. 10a represents a two dimensional portion of the array for a given value of r, and FIG. 10b represents a one dimensional portion of the array for given values of $j_1$ and $j_2$. There are $m(m-1)$ non-trivial values of $\lambda$.

Then, an array of numbers x of subintervals $I_r$ is computed as:

$$\sum_{r=1}^{x} \lambda(r,j_1,j_2) < V_L < \sum_{r=1}^{x+1} \lambda(r,j_1,j_2)$$

Each value of x is equal to the maximal number of subintervals $I_r$ which contain objects having a total size no greater than $V_L$ for each respective value of $V_L$, and each pair $j_1$, $j_2$.

Thus, for each value of group size $V_L$ (the initial group size is $V_T$), a number x of subintervals containing the corresponding number of objects is computed. Since the subinterval numbers increase with increasing value of normalized penalty change, the objects which produce the maximal reduction in cost function (negative penalty change) are selected for movement.

Figure 11:
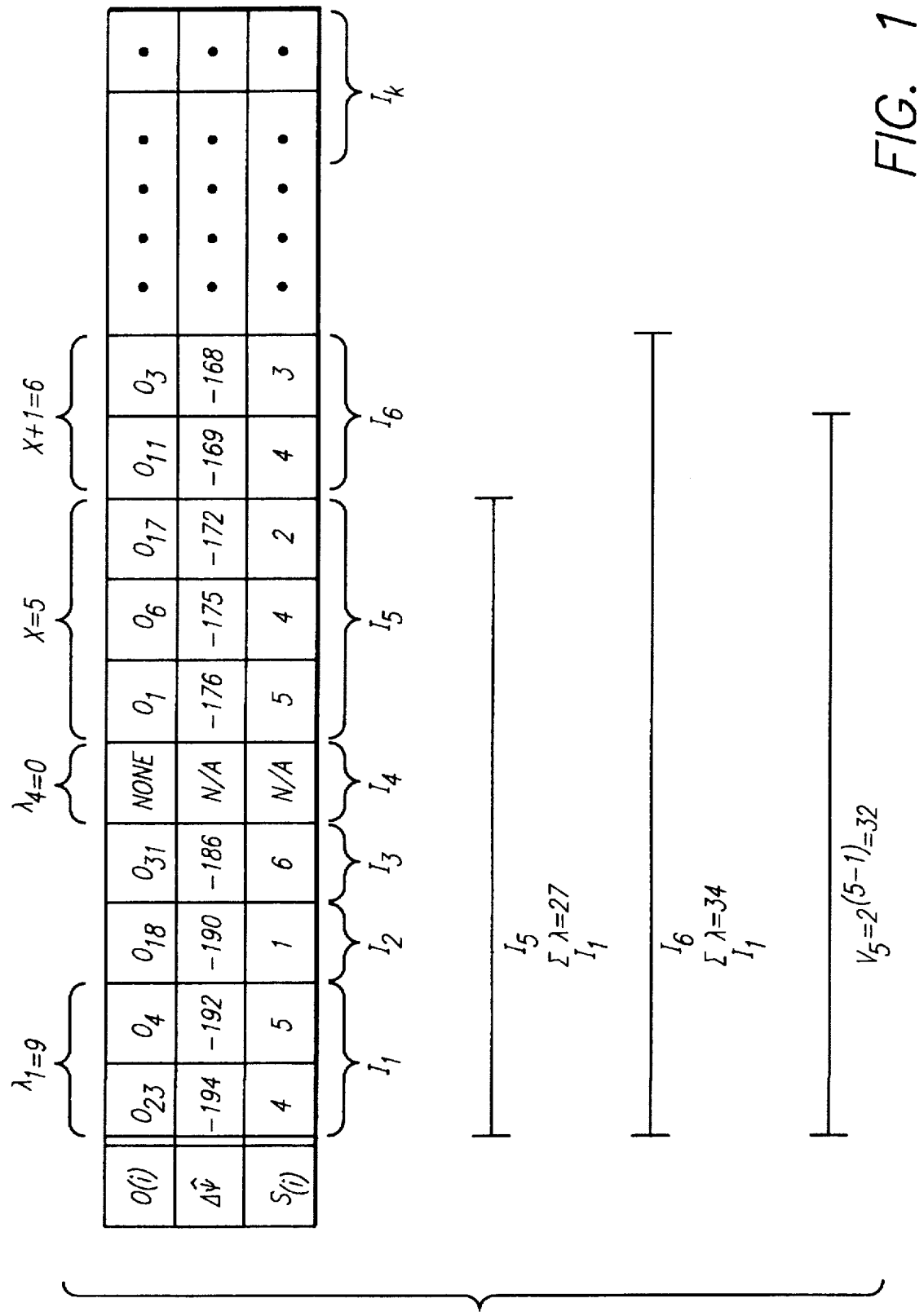
FIG. 11 is a diagram illustrating normalized penalties as assigned to subintervals of the normalized penalty scale.

FIG. 11 illustrates an example of the computation of the values of x, for one pair $j_1, j_2$. It will be assumed that MAX|$\Psi$|=98, 2M=196 and $\delta=5$, k=196/5=39.2, which is rounded up to 40. Thus, there are 40 subintervals $I_r$, with the subintervals $I_1$–$I_{39}$ having values of |5|, and the last subinterval $I_{40}$ having a value of |1|.

The values of normalized penalty change $\Delta\psi$ for the first six subintervals $I_1$ to $I_6$ are:

$I_1$ −196 to −192
$I_2$ −191 to −187
$I_3$ −186 to −182
$I_4$ −181 to −177
$I_5$ −176 to −172
$I_6$ −171 to −167

For purposes of example, it will be assumed that T=5, and $V_7 = 2^{(5-1)} = 2^4 = 32$.

The subinterval $I_1$ includes two objects $O_{23}$ and $O_4$ having normalized penalty changes $\Delta\Psi$ of −194 and −192, and sizes s of 4 and 5 respectively. The subinterval $I_2$ contains one object $O_{18}$, the subinterval $I_3$ contains one object $O_{31}$, the subinterval $I_4$ contains no objects, the subinterval $I_5$ contains three objects, and the subinterval $I_6$ contains one object.

The total group size $V_5$=32. The subintervals $I_1$–$I_5$ contain objects having a total size of 4+5+1+6+5+4+2=27. The subintervals $I_1$–$I_6$, contain objects having a total size of 34. Thus, x=5, and x+1=5+1=6, for L=5. This relationship is further illustrated in FIG. 12.

The next step is to compute an array of penalty changes $\Omega$ as:

$$\Omega(L,j_1,j_2) + \left( \sum_{r=1}^{x} \lambda(r,j_1,j_2)(-M + r\delta) \right) +$$

$$\left( V_L - \sum_{r=1}^{x} \lambda(r,j_1,j_2) \right) (-M + (x+1)\delta)$$

Figures 12, 13:
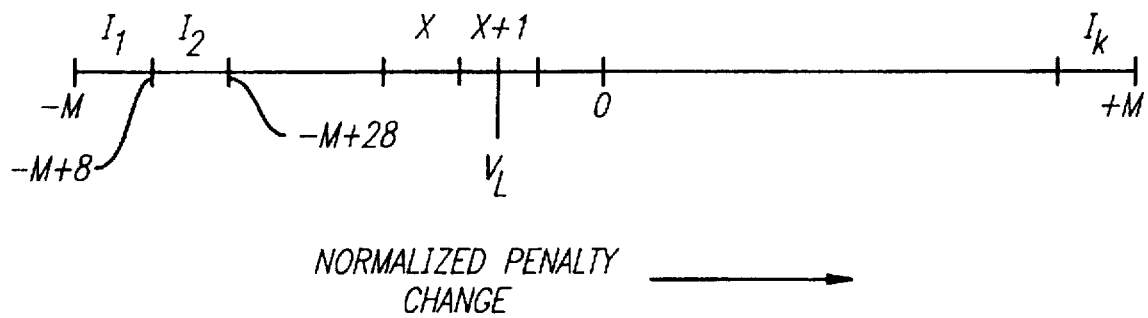
FIG. 12 is a diagram illustrating computation of a subinterval corresponding to a group size.
FIG. 13 is a diagram illustrating a two dimensional array of cost function change values.

This array is illustrated in FIG. 13, in which each element represents the change in total cost function created by moving objects having total size $V_L$ between the corresponding two regions. There is a value of $\Omega$ corresponding to each value of x. FIG. 12 further illustrates how the effect is equal to the product of the total object size and the value of the subinterval.

With the effect of moving $V_L$ objects between each two regions known, an optimal permutation is determined for which the cost function is reduced by a maximum extent.

The optimal permutation p is expressed as $$p: \{1,2 \ldots m\} \to \{1,2 \ldots m\}$$

which maps numbers from 1 to m onto themselves.

A cost change EFFECT for each possible permutation p for the selected value of $V_L$ is computed as:

$$\text{EFFECT}(p, V_L) = \sum_{j=1}^{m} \Omega(L,j,p(j))$$

The value of EFFECT is obtained by summing the individual values of $\Omega$ for each move, with a value of EFFECT being computed for each possible permutation. The optimal permutation is the one with the highest negative value of EFFECT (negative change corresponds to reduction of cost function).

The value of L is then decremented, and the process is repeated for the next lowest value of $V_L$. The goal is to determine the highest value of L which will produce an increasing reduction of cost function. If the lower value of L produces a more negative value of EFFECT, the value of L is decremented again until the new lower value produces a less negative value of EFFECT. This is expressed mathematically as:

$$\text{EFFECT}(p_1, V_L) < \text{EFFECT}(p_2, V_{L-1})$$

Figure 15:
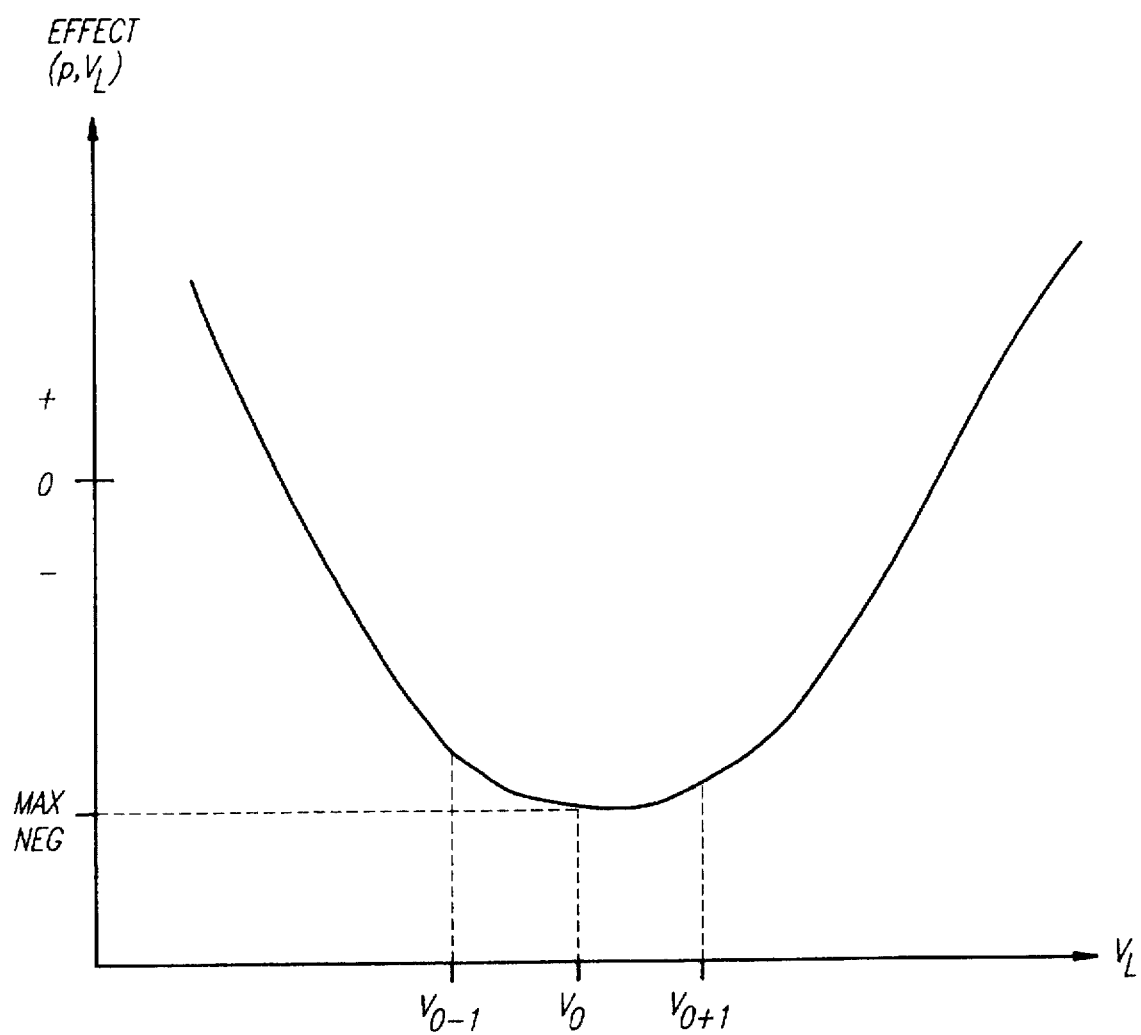
FIG. 15 is a graph illustrating computation of an optimum number of objects for movement.

As illustrated in FIG. 15, $V_o$ represents the current optimal value of $V_L$. It will be seen that the value of EFFECT varies approximately parabolically with $V_L$, and the value of $V_o$ produces a maximum negative value MAX NEG of EFFECT. A higher value $V_o+1$ produces a more positive value of EFFECT, as does a more negative value $V_o-1$.

Once the value $V_o$ and corresponding optimal permutation p have been determined, the assignment is modified by moving the number of objects having size $V_L = V_o$ through the optimal permutation. The objects for movement are selected by determining a subinterval r for each object as $$(\Psi(i,j_2) - \Psi(i,j_1)) \in I_r$$

If r ≤ x (the object is in a subinterval equal to or larger than x), then F(i)=$j_2$ (the object is moved).

If r > x (the object is in a subinterval greater than x), then F(i)=F(i) (the object is not moved).

If r=x+1 (the object is in the subinterval x), then F(i) =$j_2$ with a probability $$\frac{V_L - \sum_{r=1}^{x} \lambda(r,j_1,j_2)}{\lambda(x+1,j_1,j_2)}$$

In the latter case, a random number generator or the like (not shown) is used to generate numbers with a probability equal to the above value that the numbers will have values greater than a predetermined value. A random number is generated for each object in the subinterval x+1. If the random number is larger than the predetermined value, the object is moved. If the random number is smaller than the predetermined value, the object is not moved.

After the assignment is modified, the process branches back as illustrated in FIG. 8 to determine a new optimal permutation for the modified assignment which may or may not have a decremented value of L.

Figure 14:
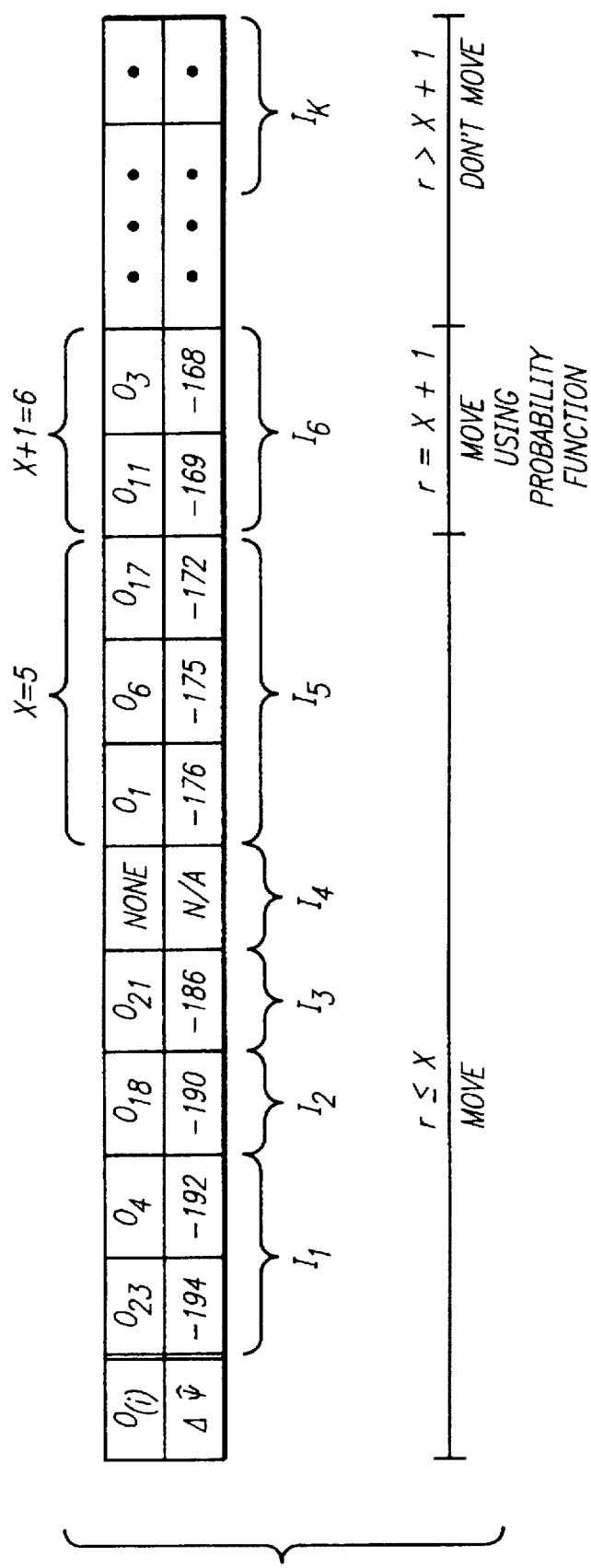
FIG. 14 is a diagram illustrating movement of objects to produce a new assignment.

The modification of the assignment is illustrated in more detail in FIG. 14 for a value of x=5. If an object is in a subinterval having a value r equal to or less than 5, it is moved. If an object is in a subinterval having a value r greater than x+1, it is not moved. If an object is in the subinterval x+1, it is moved with the probability described above.

The present invention overcomes the limitations of the prior art in that it is capable of operating on objects of different sizes and shapes. In addition, the complexity of the present process where implemented on a digital computer is linear, thereby producing results with greatly reduced run times as compared to the prior art.

Various modifications will become possible for those skilled in the art after receiving the teachings of the present disclosure without departing from the scope thereof.

We claim:

1. A process for designing an integrated circuit chip, comprising the steps of:

(a) specifying a plurality of regions on the chip in which a plurality of objects are to be placed, such that there are more of the objects than the regions;

(b) specifying penalties for the objects to be placed in the regions respectively;

(c) constructing an assignment of the objects to the regions;

(d) selecting a number of objects for movement between the regions;

(e) computing an optimal permutation of movement of the selected number of objects between the regions such that a cost corresponding to the total penalties for the assignment is maximally reduced; and (f) modifying the assignment by moving the selected number of objects through the optimal permutation.

2. A process as in claim 1, in which step (e) comprises computing the optimal permutation as starting and ending in one of the regions.

3. A process as in claim 1, further comprising the steps, performed between steps (e) and (f), of:

(g) reducing the number of objects;

(h) computing an optimal permutation of movement of the number of objects in step (g) between the regions such that a cost corresponding to the penalties for the assignment is maximally reduced; and (i) if the cost has been reduced more in step (h) than in step (g), repeating steps (g) to (i).

4. A process as in claim 3, further comprising the step, performed after step (f), of:

(j) jumping to step (e).

5. A process as in claim 3, in which steps (e) and (h) comprise computing the optimal permutations as starting and ending in one of the regions.

6. A process as in claim 3, further comprising the step of:

(g) constructing a group size scale including group size values of total sizes of numbers of objects respectively, in which:

step (d) comprises selecting the number of objects as one of the group size values.

7. A process as in claim 6, in which step (e) comprises selecting a largest one of the group size values.

8. A process as in claim 6, in which the group size scale in step (g) is constructed as:

$$V_L = \lceil C^{L-1} \rceil \; C > 1,$$

where $V_L = \ldots V_T$ are the group size values, C is a constant, and T is a maximum number such that $$V_T < \sum_{i=1}^{n} s_i$$

where i is an index for the objects, n is a total number of the objects, and $s_i$ is a size of the object having the index i.

9. A process as in claim 1, further comprising the step, performed before step (d), of:

(g) computing penalty changes for moving the objects between the regions respectively;

in which step (e) comprises the substeps of:

(g) selecting objects for movement which have largest values of negative penalty change;

(i) computing total penalty changes resulting from moving the selected objects through a plurality of possible permutations respectively; and (j) designating the optimal permutation a one of the possible permutations having a maximum negative total penalty change.

10. A process as in claim 9, in which:

the objects have different sizes; and the penalties and penalty changes are normalized in accordance with the sizes of the objects.

11. A process as in claim 10, in which:

step (d) comprises selecting the number of objects for movement as corresponding to a total size of objects for movement;

step (g) comprises computing a penalty change scale which is normalized in accordance with the sizes of the objects and has a plurality of subintervals; and step (h) comprises selecting the objects for movement having normalized penalty changes in a number of subintervals having largest values of negative normalized penalty change corresponding to the total size of objects for movement.

12. A process as in claim 1, in which step (f) comprises the substeps of:

(g) computing penalty changes for moving the objects between the regions respectively;

(h) defining a penalty change scale having a plurality of subintervals;

(i) assigning the objects to the penalty change scale in accordance with their penalty changes respectively; and (j) moving the objects which have penalty changes in a number of subintervals having largest values of negative penalty change.

13. A process as in claim 1, further comprising the steps, performed before step (d), of:

(g) computing normalized penalties $\Psi$ corresponding to the penalties $\psi$ specified in step (b) as $$\Psi(i,j) = \frac{\psi(i,j)}{s_i}$$

where i is an index for the objects, j is an index for the regions, and s is a size of the object having the index i;

(h) computing a normalized penalty change scale having a minimum value $-M$ and a maximum value $+M$, where $M = 2 \times MAX |\Psi(i,j)|$;

(i) dividing the normalized penalty change scale into k subintervals $I_r = I_1 \ldots I_k$, where $k = 2M/\delta$, and $\delta$ is a constant;

in which step (e) comprises the substeps of:

(j) computing an array of object sizes $\lambda$ as $$\lambda(r,j_1,j_2) = \Sigma S_i \, i, F(i) = j_1, (\Psi(i,j_2) - \Psi(i,j_1)) \, \epsilon I_r$$

where r is an index for the subintervals;

(k) computing an array of numbers x of subintervals $I_r$ as $$\sum_{r=1}^{x} \lambda(r,j_1,j_2) < V_1 < \sum_{r=1}^{x+1} \lambda(r,j_1,j_2)$$

(1) computing an array of penalty changes $\Psi$ as $$\Omega(L,j_1,j_2) + \left( \sum_{r=1}^{x} \lambda(r,j_1,j_2)(-M + r\delta) \right) +$$

$$\left( V_L - \sum_{r=1}^{x} \lambda(r,j_1,j_2) \right) (-M + (x+1)\delta)$$

(m) computing a cost change EFFECT for a plurality of possible permutations p for the selected number of objects as represented by a total size of objects for movement $V_L$ as $$\text{EFFECT}(p, V_L) = \sum_{j=1}^{m} \Omega(L, j, p(j))$$

where m is the total number of regions; and (n) designating the optimal permutation as the permutation p for which EFFECT has a maximal negative value.

14. A process as in claim 13, in which step (f) comprises the substeps of:

(n) determining a subinterval r for each object as $$(\Psi(i,j_2) - \Psi(i,j_1)) \in I_r$$

(o) if $r \leq x$, $F(i) = j_2$;

(p) if $r > x$, $F(i) = F(i)$;

(q) if $r = x+1$, $F(i) = j_2$ with a probability $$\frac{V_L - \sum_{r=1}^{x} \lambda(r, j_1, j_2)}{\lambda(x+1, j_1, j_2)}$$

15. A process as in claim 1, in which the objects are microelectronic cells.

16. A programmed digital computer for designing an integrated circuit chip, comprising:

memory means for storing a program including instructions and data; and processing means for executing the program;

the processing means, memory means and program operating in combination for performing the steps of:

(a) specifying a plurality of regions on the chip in which a plurality of objects are to be placed, such that there are more of the objects than the regions;

(b) specifying penalties for the objects to be placed in the regions respectively;

(c) constructing an assignment of the objects to the regions;

(d) selecting a number of objects for movement between the regions;

(e) computing an optimal permutation of movement of the selected number of objects between the regions such that a cost corresponding to the total penalties for the assignment is maximally reduced; and (f) modifying the assignment by moving the selected number of objects through the optimal permutation.

17. A programmed digital computer as in claim 16, in which step (e) comprises computing the optimal permutation as starting and ending in one of the regions.

18. A programmed digital computer as in claim 16, further comprising the steps, performed between steps (e) and (f), of:

(g) reducing the number of objects;

(h) computing an optimal permutation of movement of the number of objects in step (g) between the regions such that a cost corresponding to the penalties for the assignment is maximally reduced; and (i) if the cost has been reduced more in step (h) than in step (g), repeating steps (g) to (i).

19. A programmed digital computer as in claim 18, further comprising the step, performed after step (f), of:

(j) jumping to step (e).

20. A programmed digital computer as in claim 18, in which steps (e) and (h) comprise computing the optimal permutations as starting and ending in one of the regions.

21. A programmed digital computer as in claim 18, further comprising the step of:

(g) constructing a group size scale including group size values of total sizes of numbers of objects respectively, in which:

step (d) comprises selecting the number of objects as one of the group size values.

22. A programmed digital computer as in claim 21, in which step (e) comprises selecting a largest one of the group size values.

23. A programmed digital computer as in claim 21, in which the group size scale in step (g) is constructed as:

$$V_L = \lceil C^{L-1} \rceil \ C > 1,$$

where $V_L = \ldots V_T$ are the group size values, C is a constant, and T is a maximum number such that $$V_T < \sum_{i=1}^{n} S_i$$

where i is an index for the objects, n is a total number of the objects, and $s_i$ is a size of the object having the index i.

24. A programmed digital computer as in claim 16, further comprising the step, performed before step (d), of:

(g) computing penalty changes for moving the objects between the regions respectively;

in which step (e) comprises the substeps of:

(g) selecting objects for movement which have largest values of negative penalty change;

(i) computing total penalty changes resulting from moving the selected objects through a plurality of possible permutations respectively; and (j) designating the optimal permutation a one of the possible permutations having a maximum negative total penalty change.

25. A programmed digital computer as in claim 24, in which:

the objects have different sizes; and the penalties and penalty changes are normalized in accordance with the sizes of the objects.

26. A programmed digital computer as in claim 25, in which:

step (d) comprises selecting the number of objects for movement as corresponding to a total size of objects for movement;

step (g) comprises computing a penalty change scale which is normalized in accordance with the sizes of the objects and has a plurality of subintervals; and step (h) comprises selecting the objects for movement having normalized penalty changes in a number of subintervals having largest values of negative normalized penalty change corresponding to the total size of objects for movement.

27. A programmed digital computer as in claim 16, in which step (f) comprises the substeps of:

(g) computing penalty changes for moving the objects between the regions respectively;

(h) defining a penalty change scale having a plurality of subintervals;

(i) assigning the objects to the penalty change scale in accordance with their penalty changes respectively; and (j) moving the objects which have penalty changes in a number of subintervals having largest values of negative penalty change.

28. A programmed digital computer as in claim 16, further comprising the steps, performed before step (d), of:

(g) computing normalized penalties $\Psi$ corresponding to the penalties $\psi$ specified in step (b) as $$\Psi(i,j) = \frac{\psi(i,j)}{s_i}$$

where i is an index for the objects, j is an index for the regions, and s is a size of the object having the index I;

(h) computing a normalized penalty change scale having a minimum value −M and a maximum value +M, where $M=2\times MAX|\Psi(i,j)|$;

(i) dividing the normalized penalty change scale into k subintervals $I_1 \ldots I_k$, where $k \approx 2M/\delta$, and $\delta$ is a constant;

in which step (e) comprises the substeps of:

(j) computing an array of object sizes $\lambda$ as $$\lambda(r,j_1,j_2) = \Sigma S_i, F(i)=j_1, (\Psi(i,j_2)-\Psi(i,j_1)) \in I_r$$

where r is an index for the subintervals;

(k) computing an array of numbers x of subintervals $I_q$ as $$\sum_{r=1}^{x} \lambda(r,j_1,j_2) < V_L < \sum_{r=1}^{x+1} \lambda(r,j_1,j_2)$$

(l) computing an array of penalty changes $\Omega$ as $$\Omega(L,j_1,j_2) + \left( \sum_{r=1}^{x} \lambda(r,j_1,j_2)(-M+r\delta) \right) +$$

$$\left( V_L - \sum_{r=1}^{x} \lambda(r,j_1,j_2) \right) (-M+(x+1)\delta)$$

(m) computing a cost change EFFECT for a plurality of possible permutations p for the selected number of objects as represented by a total size of objects for movement $V_L$ as $$EFFECT(p, V_L) = \sum_{j=1}^{m} \Omega(L,j,p(j))$$

where m is the total number of regions; and (n) designating the optimal permutation as the permutation p for which EFFECT has a maximal negative value.

29. A programmed digital computer as in claim 28, in which step (f) comprises the substeps of:

(n) determining a subinterval r for each object as $$(\Psi(i,j_2)-\Psi(i,j_1)) \in I_r$$

(o) if $r \leq x$, $F(i)=j_2$;

(p) if $r>x$, $F(i)=F(i)$;

(q) if $r=x+1$, $F(i)=j_2$ with a probability $$\frac{V_L - \sum_{r=1}^{x} \lambda(r,j_1,j_2)}{\lambda(x+1,j_1,j_2)}.$$

30. A programmed digital computer as in claim 16, in which the objects are microelectronic cells.

31. A physical design automation system for designing an integrated circuit chip, comprising:

region specifying means for specifying a plurality of regions on the chip in which a plurality of objects are to be placed, such that there are more of the objects than the regions;

penalty specifying means for specifying penalties for the objects to be placed in the regions respectively;

assignment constructing means for constructing an assignment of the objects to the regions;

object selecting means for selecting a number of objects for movement between the regions;

optimal permutation computing means for computing an optimal permutation of movement of the selected number of objects between the regions such that a cost corresponding to the total penalties for the assignment is maximally reduced; and assignment modifying means for modifying the assignment by moving the selected number of objects through the optimal permutation.

32. A programmed digital computer as in claim 31, in which the objects are microelectronic cells.

* * * * *